United States Patent
Dong et al.

(10) Patent No.: US 7,977,598 B2
(45) Date of Patent: Jul. 12, 2011

(54) APPARATUS AND METHOD FOR REMOVAL OF SURFACE OXIDES VIA FLUXLESS TECHNIQUE INVOLVING ELECTRON ATTACHMENT AND REMOTE ION GENERATION

(75) Inventors: Chun Christine Dong, Macungie, PA (US); Wayne Thomas McDermott, Fogelsville, PA (US); Richard E. Patrick, Tamaqua, PA (US); Alexander Schwarz, Bethlehem, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 50 days.

(21) Appl. No.: 10/819,277

(22) Filed: Apr. 7, 2004

(65) Prior Publication Data

US 2004/0231597 A1 Nov. 25, 2004

Related U.S. Application Data

(63) Continuation-in-part of application No. 10/425,426, filed on Apr. 28, 2003.

(51) Int. Cl.
*B23K 1/00* (2006.01)
(52) U.S. Cl. .................. 219/85.22; 219/78.14; 219/85.1; 219/78.13; 219/78.01
(58) Field of Classification Search ............... 219/85.22, 219/78.14, 85.1, 78.13, 78.01
See application file for complete search history.

(56) References Cited

U.S. PATENT DOCUMENTS

| | | |
|---|---|---|
| 3,343,027 A | 9/1967 | Frohlich |
| 3,628,079 A | 12/1971 | Dobbs et al. |
| 3,742,213 A | 6/1973 | Cohen et al. |
| 4,379,218 A * | 4/1983 | Grebe et al. ............. 219/121.14 |
| 4,577,461 A | 3/1986 | Cann |
| 4,626,648 A | 12/1986 | Browning |
| 5,105,761 A | 4/1992 | Charlet et al. |
| 5,239,161 A | 8/1993 | Lang |
| 5,262,001 A | 11/1993 | Takehara |
| 5,345,056 A | 9/1994 | Frei et al. |
| 5,369,337 A * | 11/1994 | Yanagi et al. ............. 315/111.81 |

(Continued)

FOREIGN PATENT DOCUMENTS

DE 2913464 A1 10/1980

(Continued)

OTHER PUBLICATIONS

N. Potter, et al., "Fluxless Soldering Under Activated Atmosphere at Ambient Pressure.".

(Continued)

*Primary Examiner* — M. Alexandra Elve
(74) *Attorney, Agent, or Firm* — Rosaleen P. Morris-Oskanian

(57) ABSTRACT

The present invention provides a method and apparatus for the dry fluxing of at least one component and/or solder surface via electron attachment. In one embodiment, there is provided a method for removing oxides from the surface of a component comprising: providing a component on a substrate wherein the substrate is grounded or has a positive electrical potential to form a target assembly; passing a gas mixture comprising a reducing gas through an ion generator comprising a first and a second electrode; supplying an amount of voltage to at least one of the first and second electrodes sufficient to generate electrons wherein the electrons attach to at least a portion of the reducing gas and form a negatively charged reducing gas; and contacting the target assembly with the negatively charged reducing gas to reduce the oxides on the component.

23 Claims, 10 Drawing Sheets

U.S. PATENT DOCUMENTS

| | | | |
|---|---|---|---|
| 5,409,543 A | 4/1995 | Panitz et al. | |
| 5,411,645 A * | 5/1995 | Tench | 205/704 |
| 5,433,820 A | 7/1995 | Sindzingre et al. | |
| 5,693,241 A | 12/1997 | Banks et al. | |
| 5,722,581 A | 3/1998 | Sindzingre et al. | |
| 5,770,098 A * | 6/1998 | Araki et al. | 216/67 |
| 5,807,614 A | 9/1998 | Sindzingre et al. | |
| 5,807,615 A | 9/1998 | Sindzingre et al. | |
| 5,837,958 A | 11/1998 | Fornsel | |
| 5,858,312 A | 1/1999 | Sindzingre et al. | |
| 5,928,527 A | 7/1999 | Li et al. | |
| 5,941,448 A | 8/1999 | Sindzingre et al. | |
| 5,985,378 A | 11/1999 | Paquet | |
| 6,004,631 A * | 12/1999 | Mori | 427/534 |
| 6,006,763 A | 12/1999 | Mori et al. | |
| 6,007,637 A | 12/1999 | Sindzingre et al. | |
| 6,021,940 A | 2/2000 | Sindzingre et al. | |
| 6,037,241 A | 3/2000 | Powell et al. | |
| 6,077,388 A | 6/2000 | Freeman | |
| 6,089,445 A | 7/2000 | Sindzingre et al. | |
| 6,100,496 A | 8/2000 | Takuya et al. | |
| 6,158,648 A | 12/2000 | Mori et al. | |
| 6,174,500 B1 | 1/2001 | Uno et al. | |
| 6,193,135 B1 | 2/2001 | Fang et al. | |
| 6,194,036 B1 | 2/2001 | Babayan et al. | |
| 6,196,446 B1 | 3/2001 | Fang et al. | |
| 6,203,637 B1 * | 3/2001 | Dommann et al. | 156/73.1 |
| 6,440,864 B1 * | 8/2002 | Kropewnicki et al. | 438/710 |
| 6,732,911 B2 * | 5/2004 | Matsuki et al. | 228/219 |
| 7,079,370 B2 * | 7/2006 | Dong et al. | 361/230 |
| 7,387,738 B2 * | 6/2008 | Dong et al. | 216/13 |
| 2003/0029837 A1 * | 2/2003 | Trow | 216/67 |
| 2003/0047591 A1 * | 3/2003 | Dong et al. | 228/220 |
| 2003/0223528 A1 * | 12/2003 | Miley et al. | 376/113 |
| 2004/0226831 A1 * | 11/2004 | Dong et al. | 205/658 |
| 2005/0150516 A1 | 7/2005 | Fujii et al. | |

FOREIGN PATENT DOCUMENTS

| | | |
|---|---|---|
| DE | 19963904 A1 | 8/2001 |
| EP | 0 207 731 A | 1/1987 |
| EP | 0 207 731 A2 | 1/1987 |
| EP | 1 291 111 A1 | 3/2003 |
| FR | 2 586 334 A | 2/1987 |
| JP | 58-3238 | 1/1983 |
| JP | 62-13272 | 1/1987 |
| JP | 6-57397 | 3/1994 |
| JP | 8-279494 | 10/1996 |
| JP | 10 314934 A | 2/1998 |
| JP | 2002 001253 A | 1/2002 |
| WO | 95/15832 A1 | 6/1995 |
| WO | 00/65887 A1 | 11/2000 |
| WO | WO00/65887 * | 11/2000 |
| WO | WO 00/65887 | 11/2000 |

OTHER PUBLICATIONS

N. Koopman, et al., "Fluxless Flip Chip Solder Joining," pp. 919-931.

P. J. Shiloh, et al., "Flux-Free Soldering," pp. 251-273.

* cited by examiner

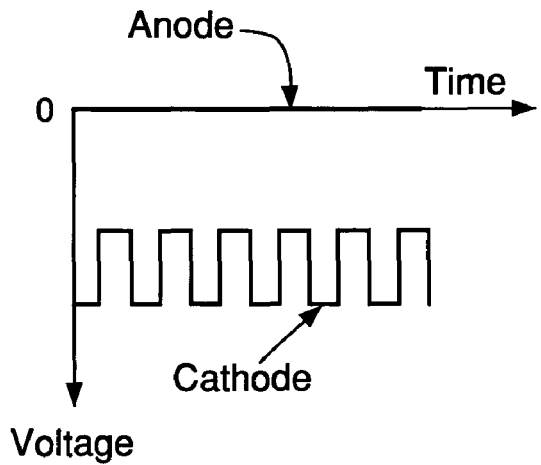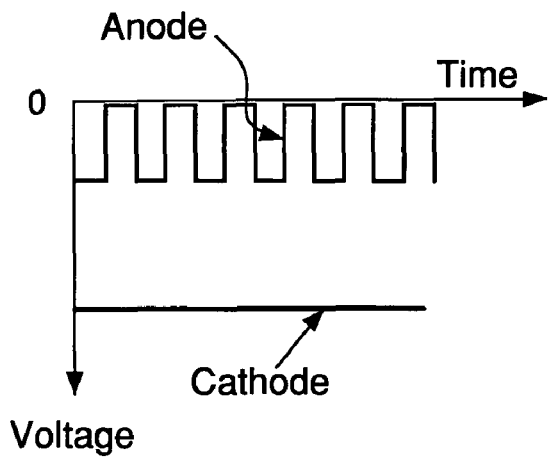
Figure 1a     Figure 1b
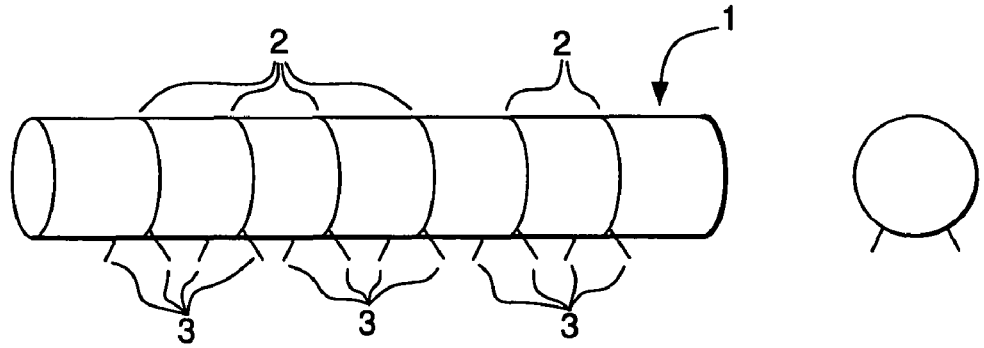
Figure 3
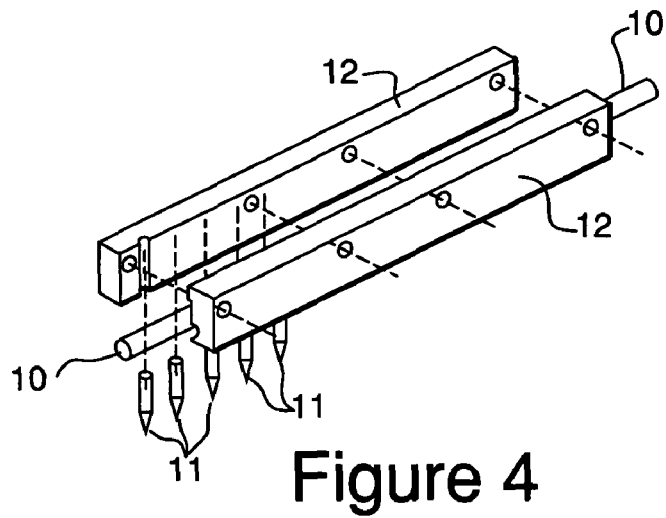
Figure 4

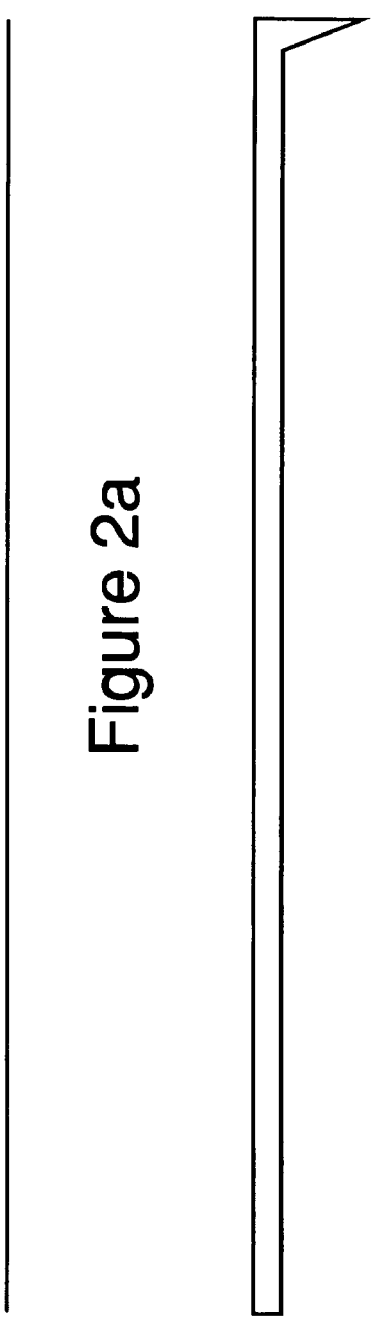
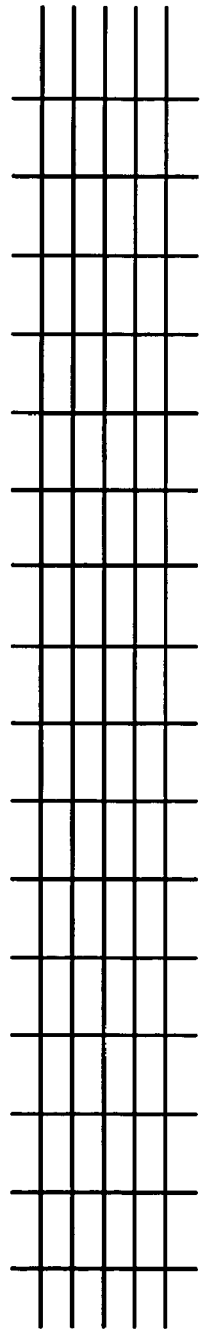
Figure 2a    Figure 2b    Figure 2c    Figure 2d 0.025" Ni/Cr Wire
With 10° Tip Sharpness

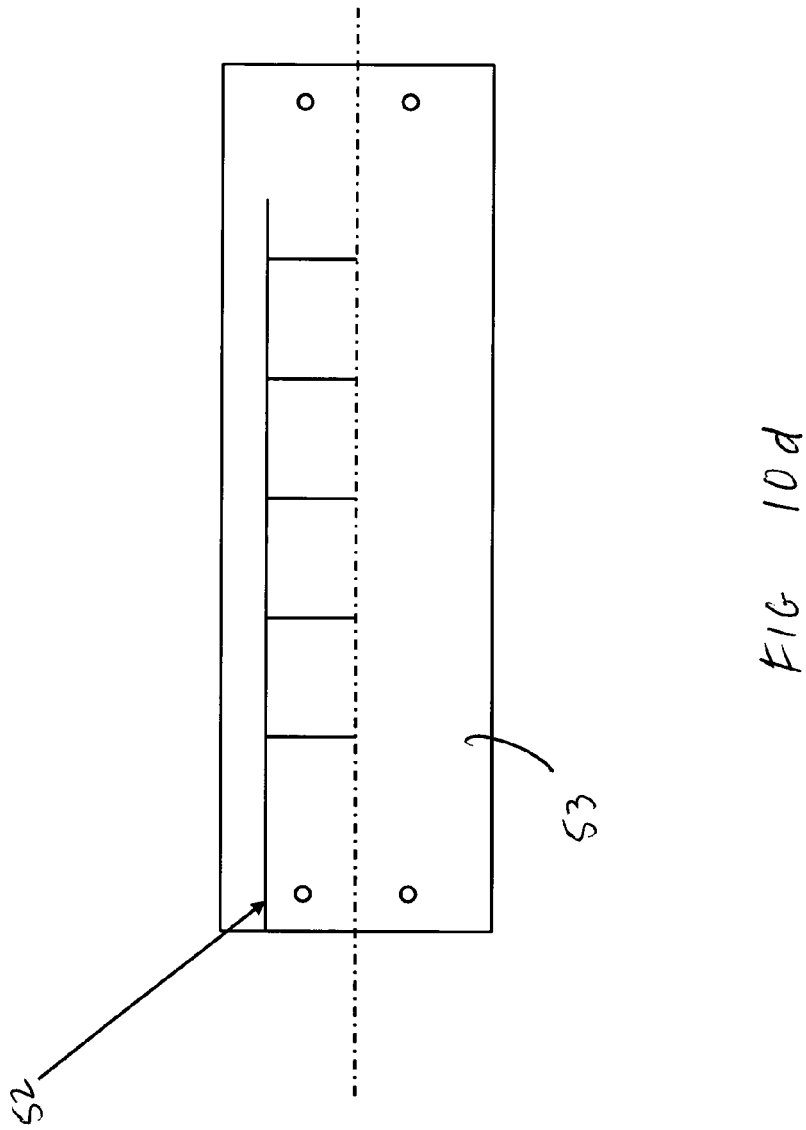

APPARATUS AND METHOD FOR REMOVAL OF SURFACE OXIDES VIA FLUXLESS TECHNIQUE INVOLVING ELECTRON ATTACHMENT AND REMOTE ION GENERATION

CROSS-REFERENCE TO RELATED APPLICATIONS

This application is a continuation-in-part of U.S. patent application Ser. No. 10/425,426, filed Apr. 28, 2003, the disclosure of which is incorporated herein by reference in its entirety.

BACKGROUND OF THE INVENTION

The present invention relates generally to fluxless processes for removing surface oxides. More specifically, the invention relates to an apparatus and method comprising same for fluxless reflow and soldering involving electron attachment within a remote ion generator.

Reflow and soldering are important processing steps in the assembly of electronic components for making solder joints. The term "reflow" as used herein refers to a process for making a previously applied solder on a substrate melt and flow upon application of an energy source such as, for example, thermal energy. The term "soldering" as used herein refers to a process that allows a melted solder to join at least two metallic substrates. A variety of different reflow and soldering processes may be used in the assembly of electronic devices, such as, but not limited to, reflow of solder bumps used for wafer bumping, reflow soldering used in the assembly of surface-mount electronic components, and wave soldering used in the assembly of insertion-mount components.

Reflow soldering is a process used for outer lead bonding of surface-mount components wherein a chip is transferred with leads in place to the next-level surface mount packages. In the reflow soldering process, components are mounted on the corresponding trace area of a circuit board with a solder paste previously printed on the circuit board. Such formed soldering parts are then loaded into a reflow furnace and passed through heating and cooling zones. Solder joints between component leads and solder lands on the circuit board are formed by melting, wetting, and solidifying the solder paste. To ensure a good wetting of the molten solder on the joining surfaces, organic fluxes are normally contained in the solder pastes to remove initial surface oxides on both solder and base metal and to keep the surfaces in a clean state before solidification. The fluxes are mostly evaporated into vapor phase during soldering, however, the flux volatiles may cause problems, such as forming voids in the solder joints and contaminating the reflow furnace. After soldering, flux residues still remain on the circuit board that can cause corrosion and electric shorts.

Wave soldering is also used for outer lead bonding such as for assembling traditional insertion mount components. It also can be used for surface-mount components by temporarily bonding the components on the circuit board by an adhesive before soldering. For both cases, the circuit boards with components inserted or temporarily bonded have to be cleaned by using a liquid flux to remove oxides on the component leads and solder lands and then passed through a high temperature molten solder bath. The molten solder automatically wets the metal surfaces to be soldered and solder joints are thus formed. The molten solder in the bath has a high tendency to be oxidized, forming solder dross. Therefore the surface of the solder bath has to be frequently cleaned by mechanically removing the dross, which increases the operation cost and the consumption of the solder. After soldering, flux residues remain on the circuit boards, which brings the same problems as described herein for reflow soldering.

Wafer bumping is a process used to make thick metal bumps on the chip bond pads for inner lead bonding. The bumps are commonly made by depositing a solder on the pads and then reflowing (referred to herein as a first reflow) to conduct alloying and to change the shape of the solder bump from a mushroom-shape into a hemispherical-shape. The chip with the first-reflowed bumps is "flipped" to correspond to the footprint of the solder wettable terminals on the substrate and then subjected to a second reflow to form solder joints. These solder joints are referred to herein as inner lead bonds. High-melting point solders (e.g., >300° C.) are normally used in the wafer bumping process because it allows for subsequent assembly steps such as outer lead bonding to proceed using lower-melting point solders (e.g., <230° C.) without disruption of the inner lead bonds.

The shape of the solder bumps after the first reflow is critical. For example, a large bump height is preferable for better bonding and higher fatigue resistance. Further, the bumps formed should preferably be substantially uniform to ensure planarity. Substantially uniform solder bumps having relatively larger bump heights is believed to be associated with an oxide-free bump surface during the first reflow. One approach for removing solder oxides during the first reflow of the solder bumped wafer is applying organic fluxes over the deposited solder bumps, or within a solder paste mixture that has been printed onto the wafer to form the bumps, and reflowing the bumps in an inert environment so that the fluxes can effectively remove initial oxides on the solder surface. However, this approach has its drawbacks. Small voids may form in the solder bumps due to flux decomposition. These voids may not only degrade the electrical and mechanical properties of the formed solder bonds but also destroy the co-planarity of the solder bumped wafer and affect the subsequent chip bonding process. The decomposed flux volatiles can also contaminant the reflow furnace which can increase the maintenance cost. In addition, flux residues are oftentimes left upon the wafer which can cause corrosion and degrade the performance of the assembly.

To remove the flux residues from the reflow and soldering processes described above, a post cleaning process may be adopted using chlorofluorcarbons (CFCs) as cleaning agents. However, post-cleaning adds an additional process step and increases the manufacturing processing time. Further, the use of chlorofluorocarbons (CFCs) as cleaning agents is banned due to the potential damage to the earth's protective ozone layer. Although no-clean fluxes have been developed by using a small amount of activators to reduce residues, there is a trade-off between the gain and loss in the amount of flux residues and the activity of the fluxes.

A good solution to all the problems described above, including void formation, flux volatiles, flux residues, and dross formation, is using a reducing gas as a reflow and soldering environment to replace organic fluxes for removing metal oxides. Such reflow and soldering techniques are called "fluxless reflow" and "fluxless soldering". Among various fluxless reflow and soldering methods, the use of hydrogen as a reactive gas to reduce oxides on base metals and solders is especially attractive because it is a very clean process (the only by-product is water which can be easily ventilated out of the furnace), and it can be compatible with an open and continued soldering production line ($H_2$ is non-toxic and has a flammable range of 4 to 75%). Therefore, hydrogen fluxless soldering has been a technical goal for a long time.

One previously used hydrogen fluxless method for inner lead bonding has been to employ pure hydrogen for reflow of the solder bumped wafer at temperatures ranging from 400 to 450° C. However, the flammable nature of the pure hydrogen largely limits its application. For soldering processes used in outer lead bonding, such as reflow soldering and wave soldering, the major limitation of using hydrogen to reduce surface oxides is the inefficient and slow reduction rate of metal oxides at the normal processing temperature ranges (<250° C.), especially for solder oxides, which have higher metal-oxygen bond strengths than that of the oxides on the base metals to be soldered. This inefficiency of hydrogen is attributed to the lack of reactivity of the hydrogen molecule at low temperatures. Highly reactive radicals, such as monoatomic hydrogen, form at temperatures much higher than the normal reflow soldering and wave soldering temperature range. For example, the effective temperature range for pure $H_2$ to reduce tin oxides on a tin-based solder is above 350° C. Such high temperatures may either damage or cause reliability problems to the packed electronic components. Therefore, a catalytic method to assist generating highly reactive $H_2$ radicals, and thus reducing the effective ranges of hydrogen concentration and processing temperature for reducing surface oxides, has been sought by the industry.

Fluxless (dry) soldering has been performed in the prior art using several techniques. One technique is to employ lasers to ablate or heat metal oxides to their vaporization temperatures. Such processes are typically performed under inert or reducing atmospheres to prevent re-oxidation by the released contaminants. However, the melting or boiling points of the oxide and base metal can be similar and it may not be desirable to melt or vaporize the base metal. Therefore, such laser processes are difficult to implement. Lasers are typically expensive and inefficient to operate and require a direct line of sight to the oxide layer. These factors limit the usefulness of laser techniques for most soldering applications.

Surface oxides can be chemically reduced (e.g., to $H_2O$) through exposure to reactive gases (e.g., $H_2$) at elevated temperatures. A mixture containing 5% or greater reducing gas in an inert carrier (e.g., $N_2$) is typically used. The reaction products (e.g., $H_2O$) are then released from the surface by desorption at the elevated temperature and carried away in the gas flow field. Typical process temperatures exceed 350° C. However, this process can be slow and ineffective, even at elevated temperatures.

The speed and effectiveness of the reduction process can be increased using more active reducing species. Such active species can be produced using conventional plasma techniques.

Gas plasmas at audio, radio, or microwave frequencies can be used to produce reactive radicals for surface de-oxidation. In such processes, high intensity electromagnetic radiation is used to ionize and dissociate $H_2$, $O_2$, $SF_6$, or other species, including fluorine-containing compounds, into highly reactive radicals. Surface treatment can be performed at temperatures below 300° C. However, in order to obtain optimum conditions for plasma formation, such processes are typically performed under vacuum conditions. Vacuum operations require expensive equipment and must be performed as a slow, batch process rather than a faster, continuous process. Also, plasmas are typically dispersed diffusely within the process chamber and are difficult to direct at a specific area. Therefore, the reactive species cannot be efficiently utilized in the process. Plasmas can also cause damage to process chambers through a sputtering process, and can produce an accumulation of space charge on dielectric surfaces, leading to possible micro-circuit damage. Microwaves themselves can also cause micro-circuit damage, and substrate or component temperature may be difficult to control during treatment. Plasmas can also release potentially dangerous ultraviolet light. Such processes also require expensive electrical equipment and consume considerable power, thereby reducing their overall cost effectiveness.

U.S. Pat. No. 5,409,543 discloses a process for producing a reactive hydrogen species (i.e., atomic hydrogen) using a hot filament to thermally dissociate molecular hydrogen in a vacuum condition. The energized hydrogen chemically reduces the substrate surface. The temperature of the hot filament may range from 500° C. to 2200° C. Electrically biased grids are used to deflect or capture excess free electrons emitted from the hot filament. The reactive species or atomic hydrogen are produced from mixtures containing 2% to 100% hydrogen in an inert carrier gas.

U.S. Pat. No. 6,203,637 discloses a process for activating hydrogen using the discharge from a thermionic cathode. Electrons emitted from the thermionic cathode create a gas phase discharge which generates active species. The emission process is performed in a separate or remote chamber containing a heated filament. Ions and activated neutrals flow into the treatment chamber to chemically reduce the oxidized metal surface. However, such hot cathode processes require vacuum conditions for optimum effectiveness and filament life. Vacuum operations require expensive equipment, which must be incorporated into soldering conveyor belt systems, thereby reducing their overall cost effectiveness.

Potier, et al., "Fluxless Soldering Under Activated Atmosphere at Ambient Pressure", Surface Mount International Conference, 1995, San Jose, Calif., and U.S. Pat. Nos. 6,146,503, 6,089,445, 6,021,940, 6,007,637, 5,941,448, 5,858,312 and 5,722,581 describe processes for producing activated $H_2$ (or other reducing gases, such as $CH_4$ or $NH_3$) using electrical discharge. The reducing gas is generally present at "percent levels" in an inert carrier gas ($N_2$). The discharge is produced using an alternating voltage source of "several kilovolts". Electrons emitted from electrodes in a remote chamber produce exited or unstable species that are substantially free of electrically charged species which are then flowed to the substrate. The resulting processes reduce oxides on the base metal to be soldered at temperatures near 150° C. However, such remote discharge chambers require significant equipment costs and are not easily retrofitted to existing soldering conveyor belt systems. In addition, these processes are typically employed for pre-treating the metal surface before soldering rather than removing solder oxides.

U.S. Pat. No. 5,433,820 describes a surface treatment process using electrical discharge or plasma at atmospheric pressure from a high voltage (1 kV to 50 kV) electrode. The electrode is placed in the proximity of the substrate rather than in a remote chamber. The free electrons emitted from the electrodes produce reactive hydrogen radicals—a plasma containing atomic hydrogen—which then pass through openings in a dielectric shield placed over the oxidized substrate. The dielectric shield concentrates the active hydrogen onto those specific surface locations requiring de-oxidation. However, such dielectric shields can accumulate surface charge that may alter the electric field and inhibit precise process control. The described process is only used to flux base metal surfaces.

Accordingly, there is a need in the art to provide an economical and efficient process for removing metal oxides from at least one component and/or solder surface under relatively low temperatures to avoid any damage to the electronic components. There is a further need in the art to provide a process and apparatus for fluxless soldering under near ambient or atmospheric pressure conditions to avoid the expense of purchasing and maintaining vacuum equipment. Additionally, there is an additional need in the art to provide a fluxless soldering process using a non-flammable gas environment.

BRIEF SUMMARY OF THE INVENTION

The present invention satisfies some, if not all, of the needs of the art by providing a method for removing metal oxides from at least one component and/or solder surface without requiring a flux. Specifically, in one aspect of the present invention, there is provided a method for removing metal oxides from a surface of at least one component comprising: providing at least one component that is connected to a substrate to form a target assembly wherein the substrate has at least one electrical potential selected from the group consisting of grounded or positive electrical potential; passing a gas mixture comprising a reducing gas through an ion generator comprising a first and a second electrode; supplying voltage to at least one of the first and the second electrodes sufficient to generate electrons that attach to at least a portion of the reducing gas and form a negatively charged reducing gas; and contacting the target assembly with the negatively charged reducing gas to reduce the oxides on the at least one component.

In another aspect of the present invention, there is provided a method of fluxless soldering of at least one component to be soldered wherein the at least one component has surface metal oxides and solder. The method comprises: providing the at least one component which is connected to a substrate as a target assembly wherein the substrate has at least one electrical potential selected from the group consisting of grounded or positive electrical potential; passing a gas mixture comprising a reducing gas and a carrier gas through an ion generator comprising a gas inlet, a gas outlet in fluid communication with the gas inlet, an anode, and a cathode interposed between the gas inlet and the gas outlet wherein the gas outlet is proximal to the target assembly; supplying energy to at least one of the cathode and the anode sufficient to generate electrons which attach to at least a portion of the reducing gas passing through the ion generator thereby forming a negatively charged reducing gas at the gas outlet; and contacting the target assembly with the negatively charged reducing gas to reduce the metal oxides on the at least one component.

In a still further aspect of the present invention, there is provided an apparatus generating a negatively charged ionic reducing gas comprising: an enclosure defining an interior hollow wherein at a least a portion of the enclosure comprises an anode connected to a first voltage level; a gas inlet and a gas outlet that is in fluid communication with the interior hollow; and a cathode residing within the interior hollow and interposed between the gas inlet and the gas outlet wherein the cathode is connected to a second voltage level which has a negative bias relative to the first voltage level.

In yet another aspect of the present invention, there is provided an apparatus for generating a negatively charged ionic reducing gas comprising: a first chamber and a second chamber. The first chamber has at least two electrodes contained therein wherein a bias in electric potential is applied between the two electrodes; a first gas inlet to receive a reducing gas; and a gas outlet to release the negatively charged ionic reducing gas. The second chamber encloses the first chamber and has a second gas inlet to receive a carrier gas wherein the second gas inlet is in fluid communication with the first chamber and the reducing gas and the carrier gas form a gas mixture within the second chamber.

These and other aspects of the invention will become apparent from the following detailed description.

BRIEF DESCRIPTION OF SEVERAL VIEWS OF THE DRAWINGS

FIGS. 1a and 1b illustrate a voltage pulse for a cathode and for an anode, respectively.

FIGS. 2a through 2i is a schematic illustration of various electrode designs for the present invention.

FIG. 3 provides an example of one embodiment of the emission electrode employing a plurality of tips.

FIG. 4 provides an example of one embodiment of the emission electrode having a segmented assembly.

FIGS. 10a, 10b, 10c, and 10d provide an exploded, side view, a detailed view of the anode, and a detailed view of the cathode holder and cathode emitted, respectively, of an additional embodiment of the ion generator apparatus of the present invention.

DETAILED DESCRIPTION OF THE INVENTION

Figure 2E:
Figure 2F:
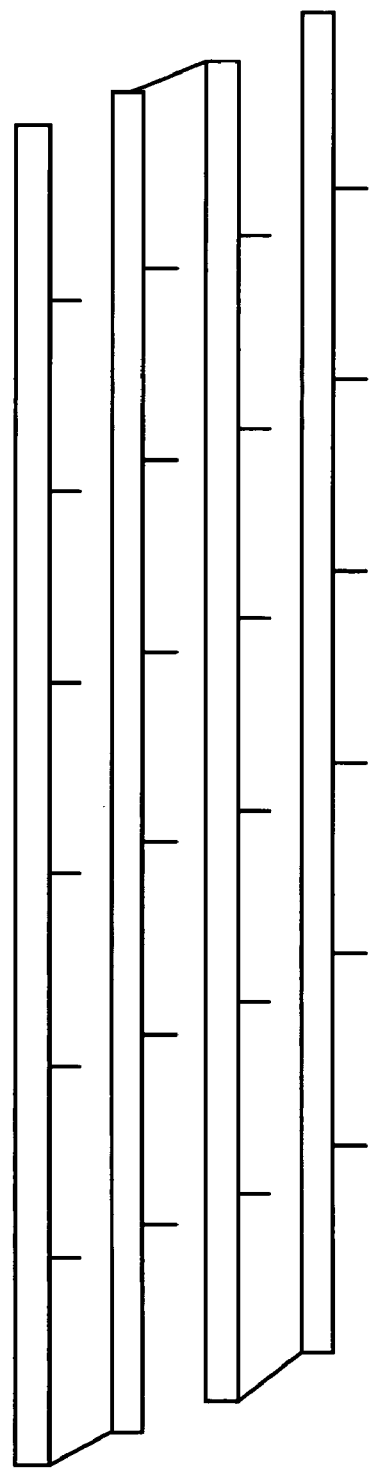
Figure 2G:
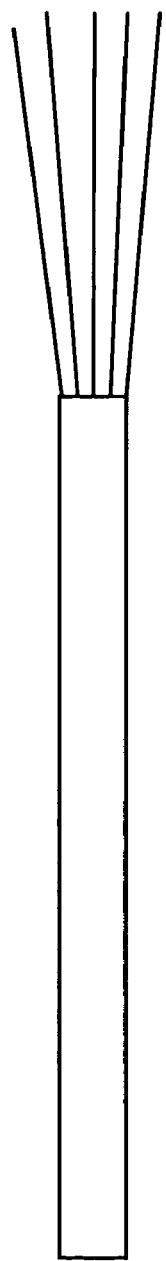
Figure 2H:
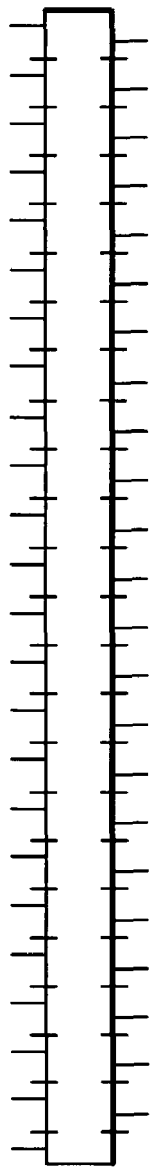
Figure 2H:
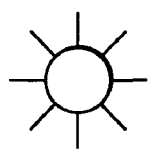
Figure 2I:
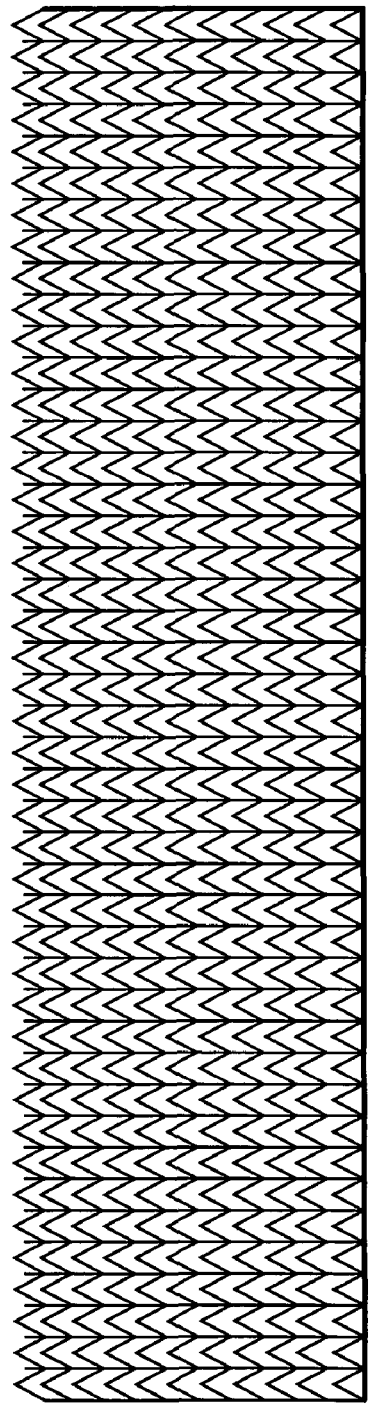

Method and apparatus for the removal of metal oxides from at least one component and/or solder surfaces by exposure to negatively charged hydrogen ions are disclosed herein. In certain embodiments, the exposure may occur before and/or during the reflow and soldering processes. The negatively charged hydrogen ions react and reduce the surface metal oxides. The present invention can be employed by modifying traditional reflow and soldering equipments such as, for example, the reflow machines used for inner lead bonding and the reflow soldering or wave soldering machines used for outer lead bonding. The present invention can also be applied to other processes wherein the removal of the surface metal oxide is desired such as, but not limited to, metal plating (i.e., the solder plating of portions of printed circuit boards or metal surfaces to make them more amenable to subsequent soldering), surface cleaning, brazing, welding, and removing surface oxides of metals, such as copper oxide, formed during silicon wafer processing. The removal of metal oxides using the method and apparatus of the present invention is equally applicable to the aforementioned processes or any other process desirous of removing oxides without the need for organic fluxes.

The ion generator apparatus disclosed herein may be particularly suitable for certain embodiments, such as for example, fluxless soldering of surface mount components including flip chip assemblies. In these embodiments, electrons may penetrate across the component and can accumulate underneath since the component may be comprised of a semiconductive material. The accumulation of electrons underneath the component can repel the negatively charged active species within the reducing gas thereby effecting the efficiency of the oxide removal. To remedy this, the position of the ion generator apparatus can be adjusted depending upon the surface configuration of the component. By using the ion generator apparatus disclosed herein, the negatively charged active species within the gas mixture can be uniformly distributed on the surface of the component to be treated regardless of the surface configuration and can allow for the optimization of operating conductions (e.g., temperature, pressure, and gas concentration) for forming the negatively charge species without limitation to the surface environment condition.

The term "component" as used herein generally relates to a component comprised of a material such as silicon, silicon coated with silicon dioxide, aluminum-aluminum oxide, gallium arsenide, ceramic, quartz, copper, glass, epoxy, or any material suitable for use within an electronic device. In certain embodiments, the component has solder disposed upon at least one of its surfaces. Exemplary solder compositions include, but are not limited to, a fluxless tin-silver, a fluxless tin-silver-copper, a fluxless tin-lead, or a fluxless tin-copper. However, the method of the present invention is suitable for a variety of different components and/or solder compositions.

While not wishing to be bound by theory, it is believed that when an energy source such as direct current (DC) voltage is applied to at least one of two electrodes contained within an remote ion generator thereby creating an electrical potential, electrons are generated from a negatively biased electrode, from the gas phase between the two electrodes, or a combination thereof and drift toward a positively biased electrode along the electric field. In certain preferred embodiments, the component in which the oxide is to be removed and/or soldered is positioned on a grounded or a positively biased substrate and is disposed within close proximity to the outlet of the remote ion generator. A gas mixture comprising a reducing gas and optionally a carrier gas is passed through the electric field generated by the electrodes within the remote ion generator. During the electron drift, part of the reducing gas forms negative ions by electron attachment which then pass through the outlet of the ion generator and attach or adsorb onto the at least one component. The attached or adsorbed negatively charged ions can thus reduce the existing oxides on the base metal and/or solder without the need for traditional fluxes. In certain preferred embodiments, the adsorption of the active species on the surfaces to be treated is promoted due to the opposite electrical charges between the active species and the surface to be treated (e.g., target assembly is positively biased).

In embodiments wherein the reducing gas comprises hydrogen, it is believed that the method of the present invention occurs as follows:

| | | |
|---|---|---|
| Dissociative Attachment: | $H_2 + e' \Rightarrow H^- + H$ | (I) |
| Radiative Attachment: | $e' + H \Rightarrow H^- + h\nu$ | (II) |
| The combination of (I) and (II): | $2e' + H_2 \Rightarrow 2H^- + h\nu$ | (III) |
| Oxide Reduction: | $2H^- + MO \Rightarrow M + H_2O + 2e'$ | (IV) |
| | (M = solder/base metal) | |

In these embodiments, the activation energy of oxide reduction using the electron attachment method of the present invention is lower than methods that use molecular hydrogen because the formation of atomic hydrogen ions with electron attachment eliminates the energy associated with bond breaking of molecular hydrogen.

Energy is supplied to at least one of the electrodes preferably the cathode, sufficient to cause electron generation from the cathode, from the gas phase between two electrodes, or combinations thereof. In certain embodiments, the energy source can be an electric energy source, such as an alternating current (AC) or direct current (DC) voltage source. Other energy sources, such as thermal energy, electromagnetic energy, or photo energy sources may also be used alone or in combination. The energy source may be constant or alternatively pulsed. In certain embodiments of the present invention, the cathode is connected to a voltage source at a first voltage level and the anode is connected to a voltage source at a second level. The difference in the voltage levels creates a bias in electrical potential. One of the first or second voltage levels may be zero indicating that either the cathode or the anode is grounded.

To produce negatively charged ions by electron attachment, a large quantity of electrons needs to be generated. In this connection, the electrons can be generated by a variety of ways such as, but not limited to, cathode emission, gas discharge, or combinations thereof. Among these electron generation methods, the selection of the method depends mainly on the efficiency and the energy level of the electrons generated. For embodiments wherein the reducing gas comprises hydrogen, electrons having an energy level approaching 4 eV may be preferred. In these embodiments, such low energy level electrons can be generated by cathode emission and/or gas discharge. The generated electrons may then drift from the cathode toward the anode which creates a space charge. The space charge provides the electron source for generating the negatively charged ions when the reducing gas passes through the at least two electrodes.

For embodiments involving electron generation through cathode emission, these embodiments may include: field emission (referred to herein as cold emission), thermal emission (referred to herein as hot emission), thermal-field emission, photoemission, and electron or ion beam emission.

Field emission involves applying an electric field between the cathode and the anode that is sufficiently high in intensity to overcome an energy barrier for electrons to be emitted from the cathode surface. In certain preferred embodiments, a DC voltage is applied between a cathode with a large surface curvature and an anode at a voltage ranging from 0.1 to 50 kV, or ranging from 1 to 30 kV. In these embodiments, the distance between the electrodes may range from 0.1 to 30 cm, or from 0.5 to 5 cm.

Thermal emission, on the other hand, involves using a high temperature to energize electrons in the cathode and separate the electrons from the metallic bond in the cathode material. In certain preferred embodiments, the temperature of the cathode may range from 800 to 3500° C., or from 800 to 1500° C. The cathode may be brought to and/or maintained at a high temperature by a variety of methods such as, but not limited to, directly heating by passing an energy source such as AC or DC current through the cathode; indirect heating such as contacting the cathode surface with an electrically insulated hot surface heated by a heating element, IR radiation, pre-heating the gas mixture to a temperature equal to or greater than the desired temperature of the cathode; or combinations thereof.

Thermal-field emission is a hybrid of field emission and thermal emission methods in which both an electric field and a high temperature are applied. Therefore, thermal-field emission may require a lesser electric field and a lower cathode temperature for generating the same quantity of electrons as compared with pure field emission and pure thermal emission. Thermal-field emission can minimize difficulties encountered with pure field emission, such as the tendency of degradation in electron emission by contamination on the emission surface, and a high restriction on the planarity and uniformity of the emission surface. Thermal-field emission may also avoid problems related to thermal emission such as a high potential of chemical reaction between the emission electrode and gas phase. In embodiments wherein the thermal-field emission is used, the temperature of the cathode can range from ambient to 3500° C., or from 150 to 1500° C. In these embodiments, the electric field can range from 0.01 to 30 KV, or from 0.1 to 10 KV.

In certain preferred embodiments, the thermal emission or thermal-field emission mechanism is used for electron generation in reflow or soldering processes. In these embodiments, the high temperature cathode used in either of these mechanisms may also act as a heat source for the gas mixture that is passed between the anode and the cathode in the ion generator. In certain embodiments, the temperature of the gas mixture inside the ion generator can be at or near the reflow and soldering temperatures so that the thermal energy required for heating the gas for reflow and soldering can be reduced. In an alternative embodiment, the temperature of the gas mixture inside the ion generator can be relatively higher than that of the reflow and soldering processes. In the latter embodiment, the electron attachment process in some cases, such as when $H_2$ is used as a reducing gas, can be promoted inside the ion generator since the formation of the negatively charge hydrogen ions by electron attachment is an endothermic reaction. The temperature of the negatively charged ionic reducing gas at the outlet of the ion generator can be reduced to the reflow and soldering temperatures by, for example, diluting the treated gas with bulk furnace gas. As long as the negatively charged ions are formed, the ions may be repelled from each other due to like-charge, thereby reducing the tendency of recombination at a reduced temperature.

In certain embodiments of the present invention, the electron generation is accomplished via a combination of cathode emission and corona discharge methods. In these embodiments, an energy source such as a DC voltage is applied between the two electrodes and electrons may be generated from both the cathode (cold or hot) and the gas (corona discharge) near the tip. The corona discharge is preferably minimized in order to increase the efficiency of forming negatively charged hydrogen ions by electron attachment and increase the lifetime of the cathode tip due to a minimized collision of the positive ions on the cathode surface.

In certain preferred embodiments of the cathode emission mechanisms described above, the voltage applied across the two electrodes may be constant or pulsed. The frequency of the voltage pulse ranges from 0 to 100 kHz. FIGS. 1a and 1b provide an illustration of a voltage pulse for a cathode and for an anode, respectively. In these embodiments, it is believed that a pulsed voltage may be preferable to a constant voltage to improve the amount of electron emission and to reduce the tendency of gas phase discharge.

For embodiments involving electron generation through gas discharge, these embodiments may include thermal discharge, photo-discharge, and various avalanche discharge, including glow discharge, arc discharge, spark discharge, and corona discharge. In these embodiments, electrons are generated by gas phase ionization. In certain embodiments of gas phase ionization, the gas phase contains a reducing gas and an inert gas, a voltage source is applied between two electrodes and electrons are generated from the inert gas between the two electrodes that then drift toward the positively biased electrode such as the anode. During this electron drift, some of these electrons may attach on the reducing gas molecules and form negatively charged ions by electron attachment. In addition, some positive ions are also created by gas phase ionization which then drift toward the negatively biased electrode such as the cathode and are neutralized at the electrode surface.

As mentioned previously, for cathode emission, the electrons are emitted from an electrode that may act as a cathode. Referring to FIGS. 2a through 2i, the electrode may have a variety of geometries, such as, for example, a thin wire 2a, a rod with a sharpened tip 2b, a rod with several sharpened tips or comb 2c, a screen or wire mesh 2d, a loose coil, an array of combs 2f, a bundle of thin wires or filament 2g, a rod with sharp tips protruding from its surface 2h, or a plate with a knurled surface 2i. Additional geometries may include combinations of the above geometries such as plates or rods with surface protrusions, rods wrapped with wire windings or filament, coils of thin wires, etc. A plurality of electrodes may be employed that may be arranged in a parallel series or in an intersecting grid. In certain embodiments, such as embodiments wherein field emission is involved, the cathode is preferably made of geometries having a large surface curvature, such as a plurality of sharp tips to maximize the electric field near the electrode surface such as the geometry depicted in FIG. 3. As FIG. 3 illustrates, electrode 1 has a series of thin wires 2 that reside within grooves on the electrode surface along with a plurality of tips 3 emanating from its surface.

The electrode material that acts as a cathode is preferably comprised of a conductive material with relatively low electron-emission energy or work function. The material preferably also has a high melting point and relatively high stability under processing conditions. Examples of suitable materials include metals, alloys, semiconductors, and oxides coated or deposited onto conductive substrates. Further examples include, but are not limited to, tungsten, graphite, high temperature alloys such as nickel chromium alloy, and metal oxides such as BaO and $Al_2O_3$ deposited onto a conductive substrate.

The electrode that acts as an anode is comprised of a conductive material such as a metal or any of the other materials described therein. The anode can have a variety of different geometries depending upon the application such as any of the geometries described herein. The anode can be grounded or connected to a voltage level with a positive bias relative to the cathode. To prevent neutralization of the negatively charged ions at the anode, the anode may have an insulating layer such as a ceramic or glass layer atop the conductive material to prevent the neutralization of the negatively charged ion at the anode.

In alternative embodiment, the neutralization of negatively charged ions to the anode surface may be minimized by applying a magnetic field during electron generation. In this embodiment, a magnetic field may be generated, such as for example, by providing one or more magnetic coils or an external magnetic source either within or outside of the ion generator apparatus and/or anode tube. Regardless of whether one or more magnetic coils are outside or inside the anode tube, the electron movement outside the tube may be driven by the electric field and the electron movement inside the tube may be confined by the magnetic field. The strength of the magnetic field that is generated may vary but generally ranges from 0.1 to 5,000 $Wb/m^2$, or from 500 to 2,000 $Wb/m^2$. In certain embodiments, a higher magnetic field may reduce the radius of the spiral path of the ion movement. In these embodiments, the radius of the ion spiral path may need to be smaller than the radius of the anode tube.

In certain embodiments of the present invention involving thermal-field emission, the cathode or emission electrode may comprise a segmented assembly such as the electrode depicted in FIG. 4. In this regard, the core 10 of the emission electrode may be made of a metal with a high electric resistance and may have a plurality of tips 11 emanating from core 10. Tips 11 may be made of a conductive material with relatively low electron emission energy or work function such as any of the materials disclosed herein. The core may be heated by directly passing an energy source such as AC or DC current (not shown) through core 10. The thermal conduction will transfer the heat from the core to tips 11. The hot core may be enclosed within an insulating material 12 having a plurality of tips 11 exposed outside the enclosure which are then inserted into a support frame thereby forming a segmented assembly as shown. The segmented assembly may allow for the thermal expansion of the core during operation. In this arrangement, electrons can be generated from hot tips 11 by applying a voltage potential between the cathode and an anode.

In another preferred embodiments of the present invention involving thermal-field emission, the temperature of the emission electrode can be raised by indirect heating. This may be accomplished by using a heating cartridge as the core of the emission electrode. The surface of the heating cartridge may be comprised of an electric conductive material such as a metal that is electrically insulated from the heating element inside the cartridge. To promote electron emission, a plurality of distributed emission tips can be mounted on the surface of the heating cartridge. The cartridge can be heated by passing an energy source such as, for example, an AC or DC current through the heating element inside the cartridge. Electrons can be emitted from the distributed tips of the cartridge by applying a negative voltage bias on the surface of the cartridge relative to a second electrode. For creating the voltage bias in this arrangement, the second electrode can be grounded so that the cartridge may be negatively biased or, alternatively, the cartridge can be grounded so that the second electrode may be positively biased. In some embodiments, the latter case may be preferable for eliminating a potential interference between two electric circuits, one is the AC or DC current along the heating element, and the another one is the high voltage bias between the surface of the cartridge and the second electrode. In these embodiments, the hot cartridge electrode may also act as a heat source for the gas mixture to achieve the required temperatures for reflow and soldering processes.

As mentioned previously, a gas mixture comprising a reducing gas is passed through the remote ion generator containing at least two electrodes. The reducing gas contained within the gas mixture may fall within one or more of the following categories: 1) an intrinsically reductant gas, 2) a gas capable of generating active species which form gaseous oxides upon reaction of the active species with the metal oxide, or 3) a gas capable of generating active species which form liquid or aqueous oxides upon reaction of the active species with the metal oxide.

The first category of gases, or an intrinsically reductant gas, includes any gas that thermodynamically acts as a reductant to the oxides to be removed. Examples of intrinsically reductant gases include $H_2$, CO, $SiH_4$, $Si_2H_6$, formic acid, alcohols such as, for example, methanol, ethanol, etc., and some acidic vapors having the following formula (III):

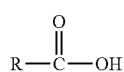

(III)

In formula (III), substituent R may be an alkyl group, substituted alkyl group, an aryl, or substituted aryl group. The term "alkyl" as used herein includes straight chain, branched, or cyclic alkyl groups, preferably containing from 1 to 20 carbon atoms, or more preferably from 1 to 10 carbon atoms. This applies also to alkyl moieties contained in other groups such as haloalkyl, alkaryl, or aralkyl. The term "substituted alkyl" applies to alkyl moieties that have substituents that include heteroatoms such as O, N, S, or halogen atoms; $OCH_3$; OR (R=alkyl $C_{1-10}$ or aryl $C_{6-10}$); alkyl $C_{1-10}$ or aryl $C_{6-10}$; $NO_2$; $SO_3R$ (R=alkyl $C_{1-10}$ or aryl $C_{6-10}$); or $NR_2$ (R=H, alkyl $C_{1-10}$ or aryl $C_{6-10}$). The term "halogen" as used herein includes fluorine, chlorine, bromine, and iodine. The term "aryl" as used herein includes six to twelve member carbon rings having aromatic character. The term "substituted aryl" as used herein includes aryl rings having substitutents that include heteroatoms such as O, N, S, or halogen atoms; $OCH_3$; OR (R=alkyl $C_{1-10}$ or aryl $C_{6-10}$); alkyl $C_{1-10}$ or aryl $C_{6-10}$; $NO_2$; $SO_3R$ (R=alkyl $C_{1-10}$ or aryl $C_{6-10}$); or $NR_2$ (R=H, alkyl $C_{1-10}$ or aryl $C_{6-10}$). In certain preferred embodiments, the gas mixture contains hydrogen.

The second category of reducing gas includes any gas that is not an intrinsically reductive but can generate active species, such as, for example, H, C, S, H', C', and S', by dissociative attachment of electron on the gas molecules and form gaseous oxides by reaction of the active species with the metal oxides to be removed. Examples of this type of gas include: $NH_3$, $H_2S$, $C_1$ to $C_{10}$ hydrocarbons such as but not limited to $CH_4$, $C_2H_4$, acidic vapors having the formula (III), and organic vapors having the following formula (IV).

(IV)

In formulas (III) and (IV), substituent R may be an alkyl group, substituted alkyl group, an aryl, or substituted aryl group.

The third category of gas includes any gas that is not an intrinsically reductive but can form active species, such as, for example, F, Cl, F', and Cl', by dissociative attachment of electron on the gas molecules and form liquid or aqueous oxides by reaction of the active species with the metal oxides. Examples of this type of gas include fluorine and chlorine containing gases, such as $CF_4$, $SF_6$, $CF_2Cl_2$, HCl, $BF_3$, $WF_6$, $UF_6$, $SiF_3$, $NF_3$, $CClF_3$, and HF.

Besides including one or more of the above categories of reducing gases, the gas mixture may further contain one or more carrier gases. The carrier gas may be used, for example, to dilute the reducing gas or diluting the reactive gas or provide collision stabilization. The carrier gas used in the gas mixture may be any gas with an electron affinity less than that of the reducing gas within the gas mixture. In certain preferred embodiments, the carrier gas is an inert gas. Examples of suitable inert gases include, but are not limited to, $N_2$, Ar, He, Ne, Kr, Xe, and Rn.

In certain preferred embodiments, the gas mixture comprises hydrogen as the reducing gas and nitrogen as the carrier gas due to its relatively lower cost and the environmental friendliness of the exhaust gas release. In these embodiments, the gas mixture comprises from 0.1 to 100% by volume, preferably 1 to 50% by volume, or more preferably from 0.1 to 4% by volume of hydrogen. Amounts of hydrogen lower than 4% are preferred, which makes gas mixture non-flammable.

In certain embodiments, the gas mixture is passed through the ion generator at a temperature ranging from ambient to 3500° C., or ranging from 150 to 1500° C. for forming active species. After passing through the ion generator, the gas mixture may then be reduced to processing temperatures, such as reflow and soldering temperatures, for surface de-oxidation. The pressure of the ion generator may range from 1 to 20 atmospheres, or from 1 to 5 atmospheres. The pressure of the negatively charged ionic reducing gas at the outlet of the ion generator can be reduced to 1 atmosphere before entering the furnace or treatment area by using, for example, a flow restricting orifice, backpressure regulator, flow controller, or similar means.

As mentioned previously, the component or work piece in which the oxide is to be removed and/or soldered is preferably disposed within close proximity to the gas outlet of the ion generator. The distance between the outlet and the top surface of the component may range from 0.1 to 30 cm, or from 0.5 to 5 cm. In certain preferred embodiments of the present invention, the component may be disposed upon a substrate to provide a target assembly. The substrate may be grounded or, alternatively, have a positively biased electrical potential. In an alternative embodiment, the component may be interposed between the outlet of the ion generator and substrate that is grounded or has a positively biased electrical potential.

In certain embodiments, the remote ion generator and/or the component (or target assembly) may be moved. In this regard, the remote ion generator may be in a fixed position and the component may be moved, the remote ion generator may be moved and the component may be in a fixed position, or both the remote ion generator and the component are moved. The movement may be vertical, horizontal, rotational, or along an arc.

Figure 5:
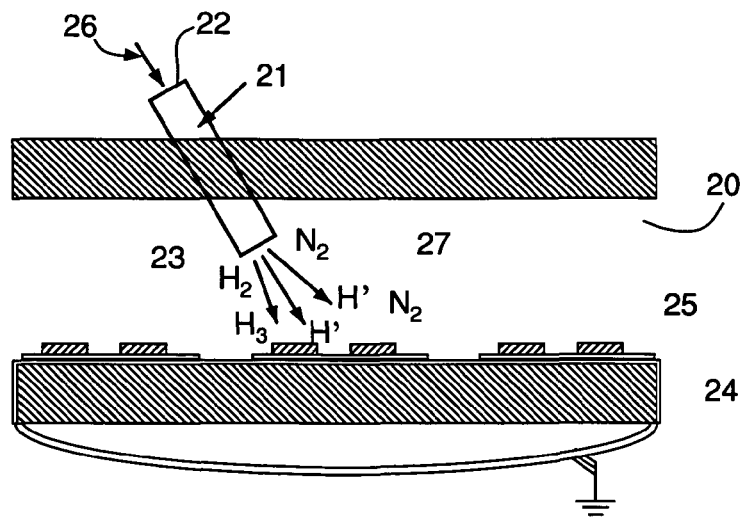
FIG. 5 provides an example of one embodiment of the present invention illustrating remote ion generation.

FIG. 5 provides an illustration of one embodiment of the present invention used, for example, in reflow soldering. The apparatus comprises an oven or furnace 20 which may typically have heating/cooling zones located at different sections along the center axis of the oven/furnace 20. A remote ion generator 21 having at least two electrodes (not shown) is inserted within the interior of oven/furnace 20. Ion generator 21 further has a gas inlet 22 and a gas outlet 23. A grounded moving belt 24 made of a conductive material, such as a metal, carries one or more components 25, such as electronic devices on a printed circuit board which are temporarily connected together by solder paste previously printed on one or more of the components, which pass through the oven/furnace 20 and the heating and cooling zones. A gas mixture 26 comprised of nitrogen and a hydrogen reducing gas is introduced into ion generator 21 through gas inlet 22, and an energy source (not shown) is applied to at least of the two electrodes acting as a cathode and an anode contained therein. The gas mixture 26 responds to the charge between the cathode and the anode by electrons being generated at the site of the cathode to the reducing gas, preferably hydrogen, to become a negatively charged ionic reducing gas 27 which passes through gas outlet 23. Gas outlet 23 is in close proximity to components 25. The negatively charged ionic reducing gas 27 reduces any existing metal oxides on the surface of component and solder thereby significantly enhancing solder joining. The solder paste is melted in a heated zone of the oven/furnace 20, wets the surface of the components and resolidifies in the cool zone of the oven/furnace 20 to form the soldered product, which requires no flux and avoids solder imperfections caused by oxides or flux residues.

Figure 6:
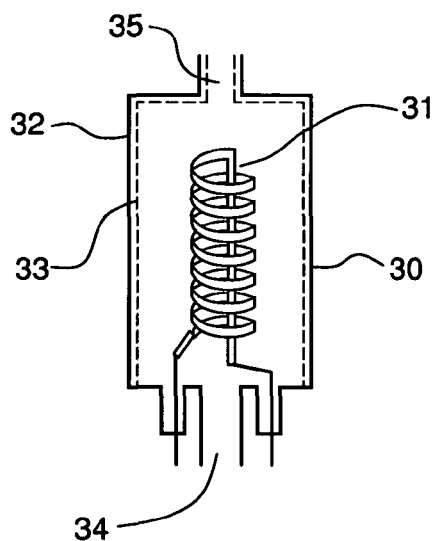
FIG. 6 provides an example of one embodiment of the ion generator apparatus of the present invention.

FIG. 6 provides an example of one embodiment of the remote ion generator apparatus 30 of the present invention. Ion generator 30 comprises at least two electrodes: a cathode 31 having a coil geometry and a metal anode 32 which comprises the walls of the apparatus. Cathode 31 and anode 32 are connected to an external energy source (not shown). Metal anode 32 further comprises a ceramic liner 33 which is disposed upon its surface as shown. Ion generator 30 further has a gas inlet 34 and gas outlet 35. The geometries of gas inlet 34 and 35 can vary with respect to each other to affect the flow velocity of the gas mixture (not shown) which passes through ion generator 30. A gas mixture (not shown) containing a reducing gas and optionally a carrier gas is passed through ion generator 30. An energy source (not shown) such as DC voltage is passed through cathode 31 and anode 32 thereby generating an electric field and causing cathode 31 to generate electrons. The electrons generated from cathode 31 drift in the direction of the electric field. The electrons attach to at least a portion of the reducing gas thereby generating a negatively charged reducing ionic gas (not shown). The negatively charged reducing ionic gas passes through the gas outlet 35 to reduce the surface oxides of the component (not shown).

Figure 7:
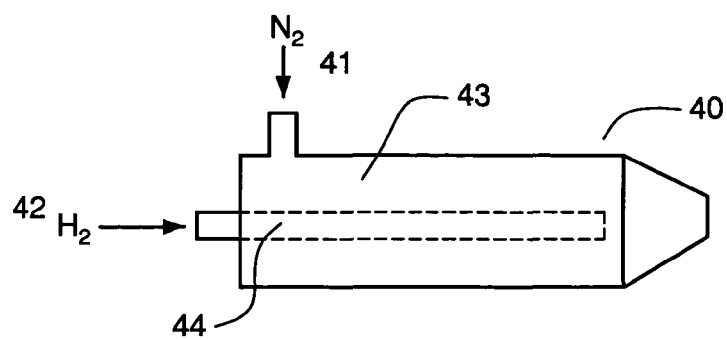
FIG. 7 provides a further example of one embodiment of the ion generator apparatus of the present invention.

FIG. 7 provides an illustration of another embodiment of the remote ion generator of the present invention. Ion generator 40 has two gas inlets 41 and 42 that flow into two concentric chambers, 43 and 44, to ensure safety for treating a concentrated reducing gas such as hydrogen. The concentrated hydrogen gas enters through gas inlet 42 into main chamber 43. Main chamber 43 is surrounded with a secondary chamber 44 that is purged with a carrier gas such as nitrogen that enters via inlet 41. The pressure of the concentrated hydrogen stream is maintained to be higher than that of nitrogen in the secondary chamber 44 and the ratio of the gas flow rates between the concentrated hydrogen stream and the nitrogen stream is adjusted to a level that the total concentration of hydrogen in the mixture of the two streams is equal to or less than 4% by volume.

Figure 10A:
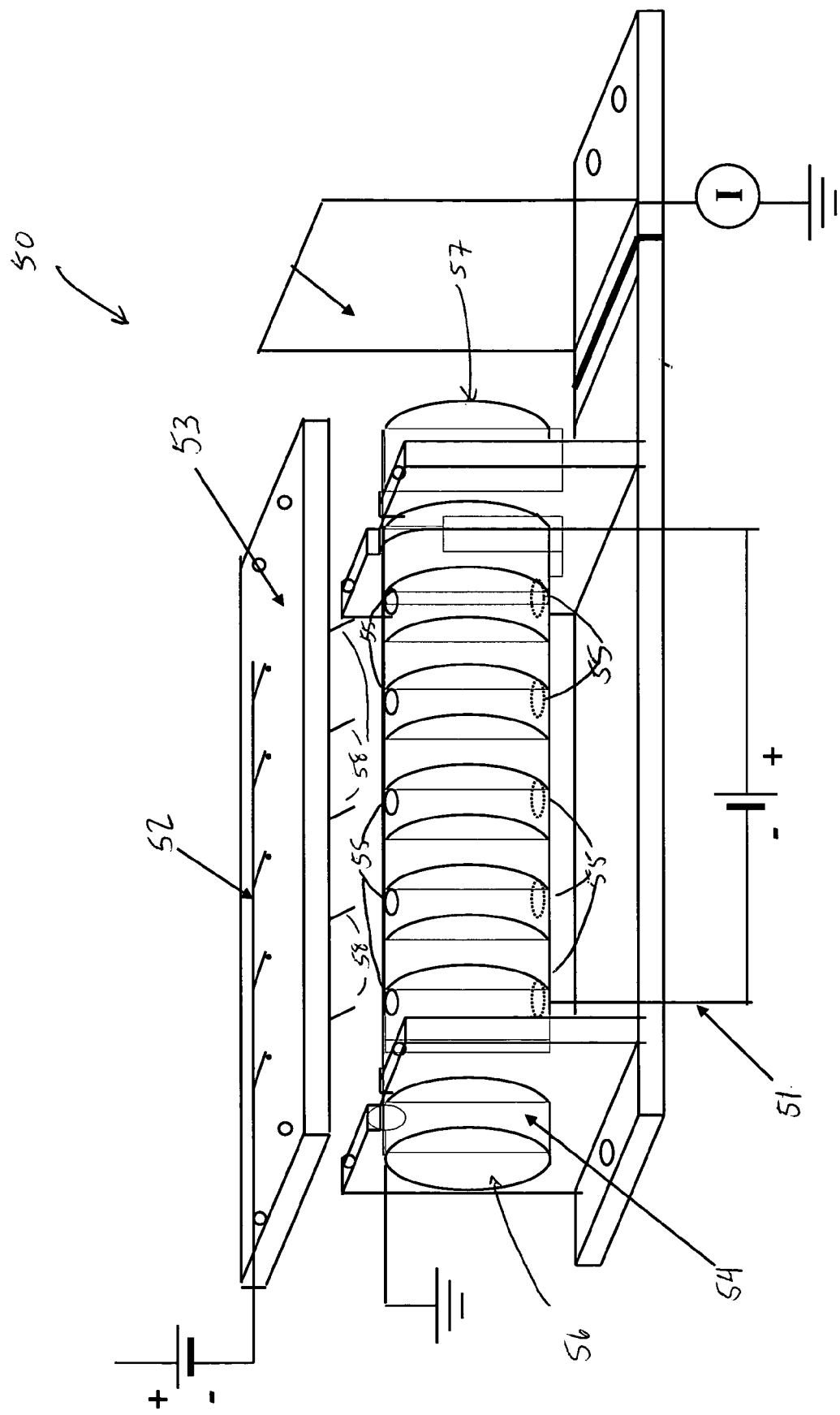
Figure 10B:
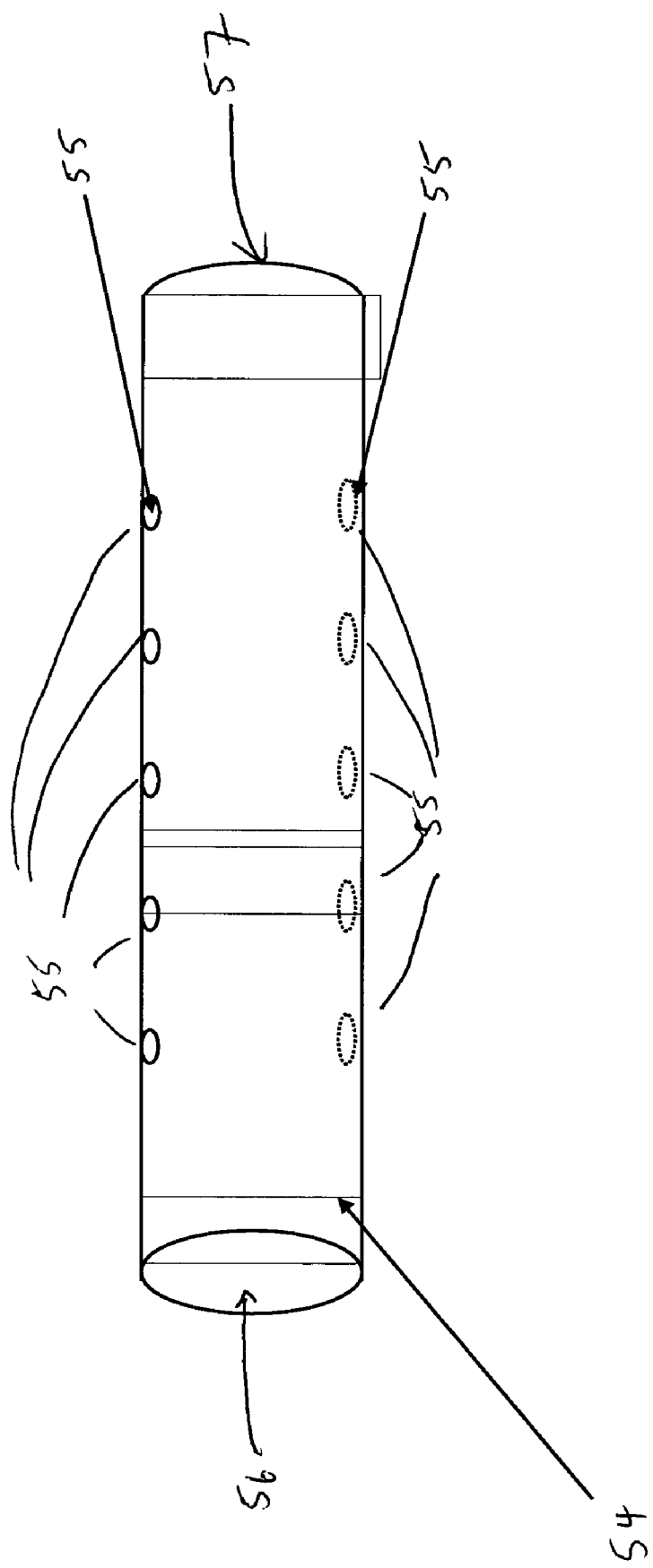
Figure 10C:
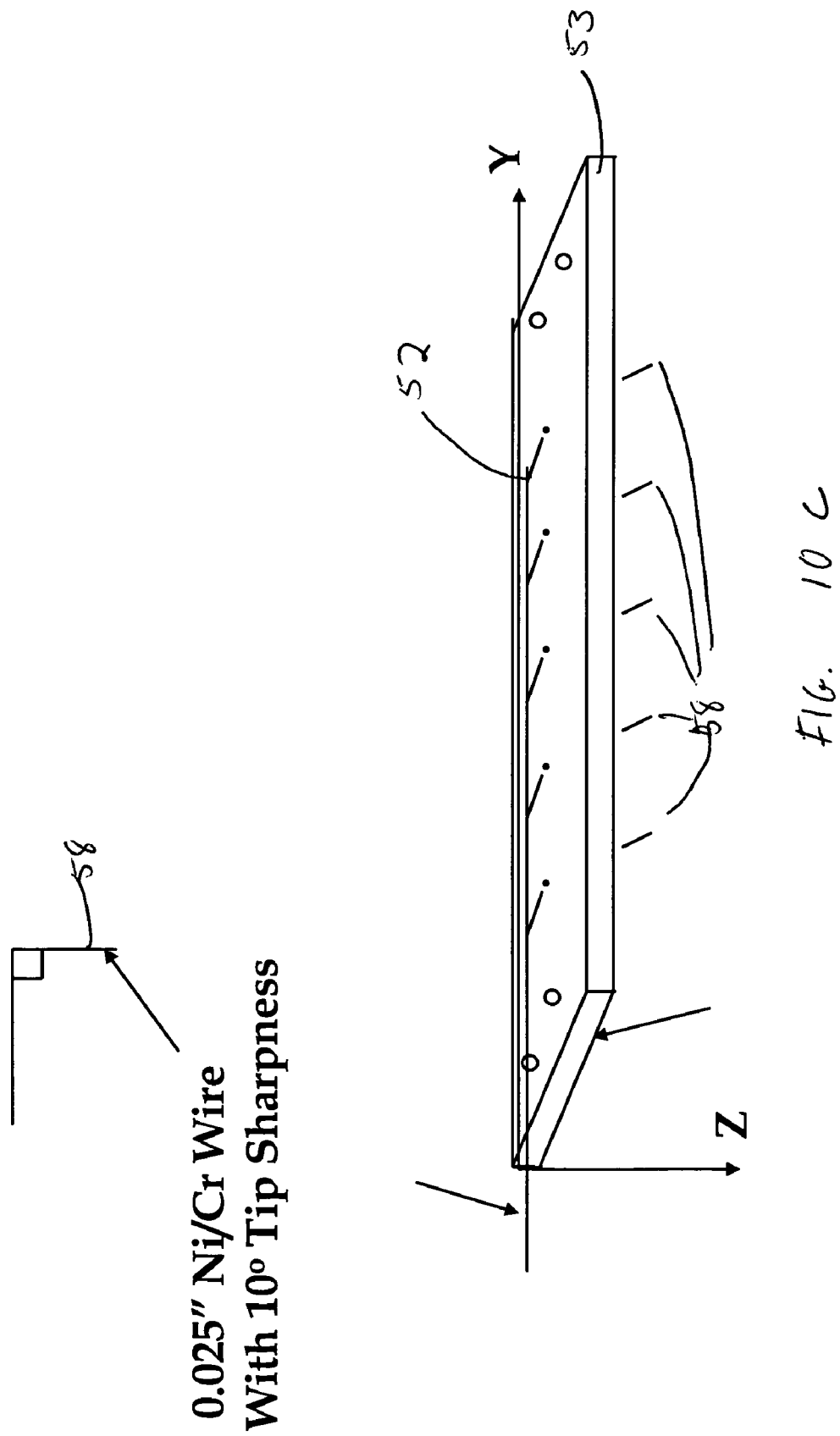

FIG. 10 provides an example of an ion generation apparatus 50 that further includes a magnetic coil 51. While apparatus 50 shows magnetic coil 51 as the source for the magnetic field, it is anticipated that other sources for generating a magnetic field besides a coil are anticipated herein. Magnetic coil 51 can reside within the internal volume anode 54 as shown, reside outside or upon anode 54, or a variety of other configurations. Ion generator 50 comprises at least two electrodes: a cathode assembly having a "comb-shaped" cathode emitter 52 (such as the electrode configuration shown in FIG. 2c) and is disposed within cathode holder 53 and anode 54 which comprises the walls of the apparatus. Cathode emitter 52 is comprised of a conductive material such as any of the materials disclosed herein. Cathode holder 53 is comprised of an insulating material. However, in alternative embodiments, cathode holder 53 can be comprised of a conductive material, an insulating material, a semiconductive material or a combination thereof. In certain embodiments, the tips of cathode emitter 58 can extend into the internal volume within anode 54 through a plurality of perforations 55 within the walls of anode 54. Alternatively, tips 58 can reside outside the internal volume within anode 54, such as the area between cathode emitter and anode 54.

Cathode emitter 52, anode 54, and magnetic coil 51 are connected to an external energy source as shown. In certain embodiments, metal anode 54 may be comprised of one or more layers of conductive material, an insulating material that is at least partially coated with a conductive material, or a variety of other configurations. Ion generator 50 further has a gas inlet 56 and gas outlet 57. The geometries of gas inlet 56 and 57 can vary with respect to each other to affect the flow velocity of the gas mixture (not shown) which passes through ion generator 50. A gas mixture (not shown) containing a reducing gas and optionally a carrier gas is passed through ion generator 50. An energy source such as DC voltage is applied between cathode emitter 52 and anode 54 thereby generating an electric field and causing cathode emitter 52 to generate electrons. The magnetic field that is generated by applying electric current flow through coil 51 or other magnetic source may aid in directing the electrons out of ion generator 50 through gas outlet 57. Parameters such as, but not limited to, the size and number of perforations 55 on anode 54, the number of windings on magnetic coil 51, the configuration, number, and angle of the conductive tips 58 on cathode emitter 52, the gap between the tips of the cathode emitter 52 and surface of anode 54, the voltage between the two electrodes, the current within magnetic coil 51 and the geometry of anode 54, can be varied to effect the amount of electrons generated.

The method disclosed herein can be used in several areas of the electronic assembly besides soldering such as, for example, surface cleaning, metal plating, brazing, welding, and reflow of a solder bumped wafer. In one embodiment, the present invention is used for the reflow of a solder bumped wafer such as the method provided in copending U.S. application Ser. No. 10/425,405, filed Apr. 28, 2003, which is assigned to the assignee of the present invention. In one particular embodiment, the method can be used to reduce surface oxides of metals, such as copper oxide, formed during silicon wafer processing. Such oxides may form as a result of the various wet processing steps, such as chemical mechanical planarization, that are used to form micro-electronic devices on the wafers. These surface oxides reduce device yield and device reliability. The method allows surface oxides to be removed in a fully dry, environmentally friendly manner that does not require the use of aqueous reducing agents. Further, since the method can be performed at relatively low temperatures, it does not significantly affect the thermal budget of the device during processing. Higher temperatures, by contrast, tend to reduce device yield and reliability by causing diffusion of dopants and oxides thereby reducing device performance. Since the method can also be performed on a single wafer, the method can be integrated with other single wafer processes, thereby providing better compatibility with other fabrication steps.

The invention will be illustrated in more detail with reference to the following examples, but it should be understood that the present invention is not deemed to be limited thereto.

EXAMPLE 1

A first experiment was conducted by using a lab-scale tube furnace having a downward-facing metal rod with a sharp tip (see FIG. 2b for cathode geometry) inserted near the center of the furnace. The sample used was a fluxless tin-lead solder preform (m.p. 183° C.) on a grounded copper plate (anode), which was loaded inside a furnace and heated up to 250° C. under a gas flow of 5% $H_2$ in $N_2$. When the sample temperature was at equilibrium, a DC voltage was applied between the negative electrode (cathode) and the grounded sample (anode) and gradually increased to about −2 kV with a current of 0.3 mA. The distance between the two electrodes was about 1 cm. The pressure was ambient, atmospheric pressure.

It was found that the solder was well wetted on the copper surface. Without applying an electric voltage, a good wetting of a fluxless solder on a copper surface can never be achieved at such low temperature, even in pure $H_2$, because the effective temperature for pure $H_2$ to remove tin-oxides on a tin-based solder is above 350° C. Therefore, this result confirms that the electron-attachment method is effective in promoting $H_2$ fluxless soldering.

It was proved in the small-scale test that the negatively charged hydrogen ions are much more reactive than neutral hydrogen gas molecules. Therefore, by using this new approach, the hydrogen reduction of oxides on both solder and base metal can be largely promoted. The effective temperature of hydrogen fluxless soldering (5 vol. % $H_2$ in $N_2$) under ambient pressure is reduced into the normal soldering temperature range (<250° C.).

EXAMPLE 2

Several cathode materials were investigated for electron-attachment assisted hydrogen fluxless soldering by using the field emission mechanism using the same set-up as Example 1. The results of the investigation is provided in Table I.

As Table I illustrates, the best result was obtained by using Ni/Cr cathode, which provided the highest fluxing efficiency and thus resulted in the shortest wetting time. A possible reason is that the Ni/Cr cathode generates a relatively larger quantity of electrons and has a suitable energy level of electrons compared to other cathode materials.

TABLE I

Effect of Cathode Material on Wetting Time at 250° C. and 20% $H_2$

| Material of Cathode Rod With a Sharp Tip (1/16" dia.) | Time to Complete Wetting |
|---|---|
| Brass | 1 min 55 sec |
| Copper | 1 min 44 sec |
| Nickel Chromium | 39 sec |
| Aluminum | 1 min 28 sec |
| Stainless Steal | 1 min |
| Tungsten | 1 min 54 sec |

EXAMPLE 3

In order to demonstrate the feasibility of the electron-attachment assisted $H_2$ fluxless soldering using a remote ion generator, an experiment was conducted wherein a remote ion generator was made using a downward-facing Ni/Cr cathode rod with a sharp tip. The anode consisted of a copper plate covered by a ceramic layer. The electric field applied between the two electrodes was about 2 KV/cm. The remote ion generator was set in front of a test sample, or in other words, toward the gas inlet of the furnace. The distance between the remote ion generator and the test sample was about 2 to 4 cm. The test sample consisting of a Sn/Pb solder perform (m.p. 183° C.) on a copper plate was grounded. When the furnace loaded with the remote ion generator and the test sample was purged with a gas mixture of $H_2$ and $N_2$ (~5% $H_2$ by volume) and heated up, it was found that at around 220° C., the solder started to wet on the copper.

EXAMPLE 4

The concept of using a hot cathode together with an electric field (thermal-field emission) to promote the efficiency of electron emission was experimentally demonstrated using a thin Ni/Cr wire (0.004" diameter) that was hung down the center of a vertically oriented tube furnace. The wire was heated by an AC power and connected to the negative side of a DC power source to provide a hot cathode. In the same furnace, a grounded metal plate was also hung in parallel to the hot wire to provide an anode. The gap between the anode and cathode was 1.43 cm. The cathode temperature was measured at various temperatures ranging from room temperature, or ambient, to 650° C. using a thermocouple in contact with the cathode surface. During the experiments, a nitrogen flow was maintained in the furnace and electrons were generated from the hot cathode.

Figure 8:
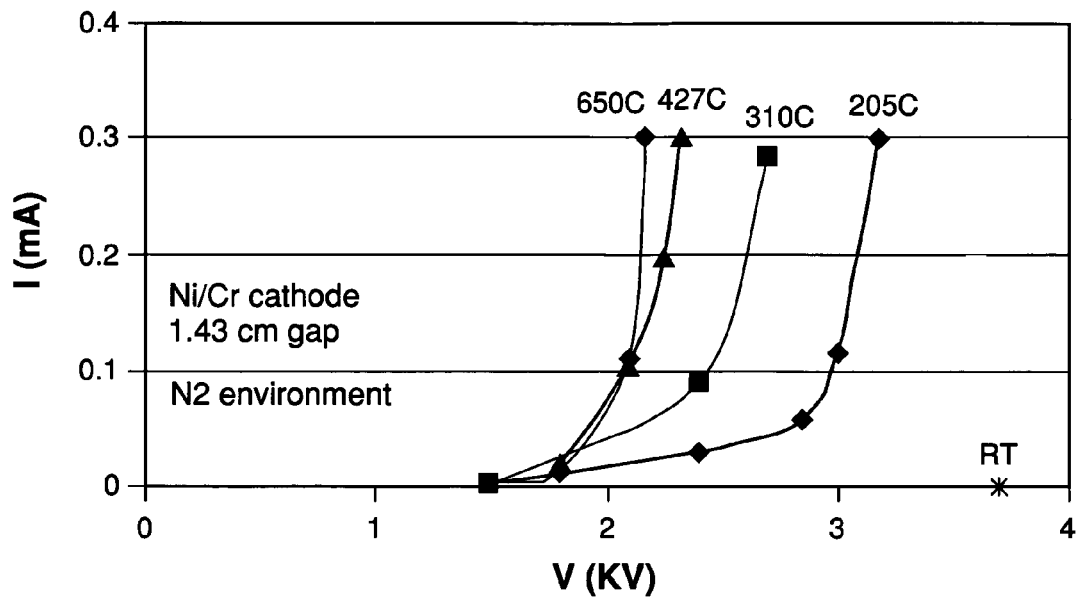
FIG. 8 provides a graph depicting voltage versus current for various cathode temperatures using one embodiment of the apparatus of the present invention.

The emission current at different cathode temperatures as a function of the applied DC voltages between the two electrodes is provided in FIG. 8. FIG. 8 illustrates that the cathode emission current is significantly increased when the cathode temperature is increased from ambient temperature to above 200° C. The greatest increase in emission current occurred below 400° C.

EXAMPLE 5

The present example was conducted to investigate the effectiveness of the thermal-field emission method for generating electrons. A 3 mm diameter graphite rod, having a number of 1 mm long machined tips protruding from its surface, acted as the cathode and had a geometry similar to that depicted in FIG. 2h. Each of the protruding machined tips had a tip angle of 25 degrees. The graphite rod was heated up in a gas mixture of 5% $H_2$ and 95% $N_2$ to about 400 to 500° C. by resistive heating using an AC power source. A DC voltage source of 5 KV was applied between the graphite cathode and an copper plate that acted as an anode having a 1.5 cm gap there between. All the tips on the graphite rod were illuminated thereby indicating that electrons could uniformly be generated from the distributed tips on the graphite rod. Without heating of the graphite rod, there would be either no electron generation from the cathode, or arcing between one of the tips and the anode plate. This demonstrates that the combination of using a cathode having multiple tips and elevated temperatures, i.e., a thermal-field emission method, is effective for obtaining uniform electron generation from an integrated emitting system.

EXAMPLE 6

The present example was conducted using a 0.04" diameter nickel-chromium alloy heating wire clamped horizontally between two machined $Al_2O_3$ refractory plates such as the electrode illustrated in FIG. 4. A series of five nickel-chromium alloy emitting wires, each with a sharp tip (12.5 degree) on one end of the wire, protruded perpendicularly from the nickel-chromium heating wire and were vertically positioned between two refractory plates. The nickel-chromium heating wire and tips were heated up in a gas mixture of 5% $H_2$ and 95% $N_2$ to about 870° C. using an AC power source. A DC voltage of 2.6 KV was applied between the cathode and a copper plate that acted as the anode having a 6 mm gap between the two electrodes. All five tips were illuminated and the total current emission reached 2.4 mA. Without heating of the wire, there would be either no electron generation from the cathode, or arcing between one of the tips and the anode plate. Like example 5, example 6 demonstrates that thermal-field emission provides uniform electron generation. Further, because of the higher temperature of the cathode, it also increases the quantity of the electron generation at a given electric potential.

EXAMPLE 7

The present example demonstrated the performance of a hot emission electrode with multiple-tips on the surface where the high temperature of the electrode is achieved by indirect heating and the voltage applied between the two electrodes is pulsed. The emission electrode had a heating cartridge as its core. The enclosure of the cartridge is made of stainless steel which is electrically insulated with a heating element inside the enclosure. Six nickel/chromium wires each having two sharp tips (12.5 degree in tip angle) that extended at an angle of 90 degrees from each other were inserted into distributed grooves on the surface of the cartridge such as that depicted in FIG. 3. The cartridge was heated to a temperature of 800° C. in an atmosphere containing 5% $H_2$ and 95% $N_2$ by passing a AC current through the heating element. A pulsed DC voltage source was applied between the surface of the emission electrode and a grounded copper electrode. The gap between the two electrodes is about 1 cm.

Figure 9:
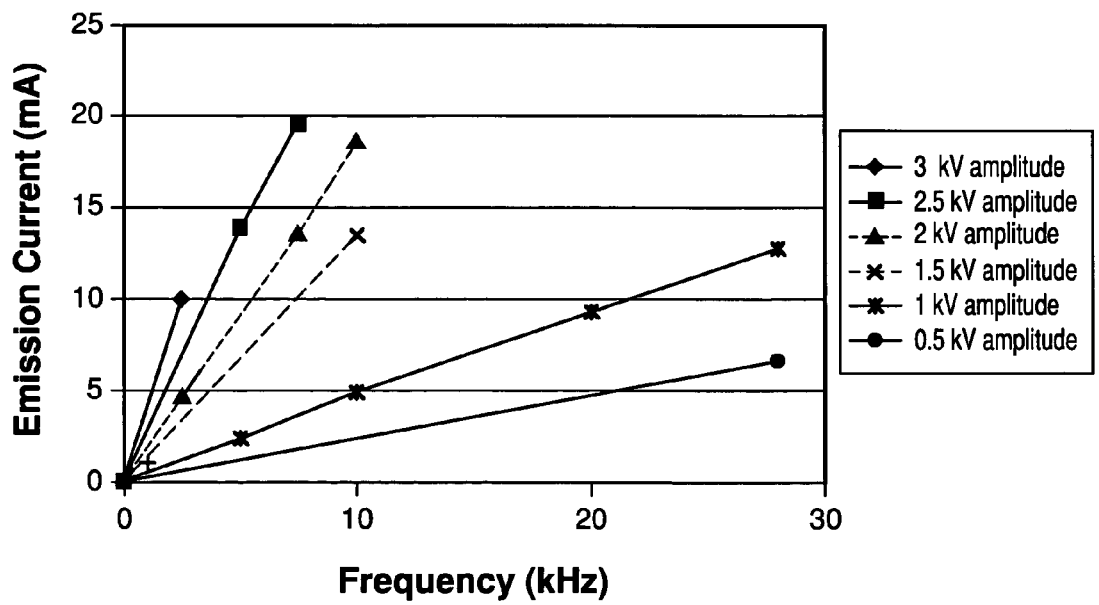
FIG. 9 shows emission current versus frequency and amplitude of pulsed voltage applied between two electrodes using one embodiment of the apparatus of the present invention.

FIG. 9 illustrates that the emission current increases when the amplitude and the frequency of the voltage pulsing is increased.

While the invention has been described in detail and with reference to specific examples thereof, it will be apparent to one skilled in the art that various changes and modifications can be made therein without departing from the spirit and scope thereof.

The invention claimed is:

1. A method of chemically reducing metal oxides to base metals on the surface of an at least one component comprising said metal oxides, the method comprising the steps of:
    providing the at least one component which is connected to a substrate as a target assembly wherein the substrate has at least one electrical potential selected from the group consisting of a grounded or a positive electrical potential;
    passing a gas mixture comprising a reducing gas through a remote ion generator comprising a gas inlet, a gas outlet in fluid communication with the gas inlet, an anode, a cathode, and a magnetic coil wherein the magnetic coil is interposed between the gas inlet and the gas outlet wherein the gas outlet is proximal to the target assembly;
    supplying energy to at least one of the cathode and the anode to generate electrons that attach to at least a portion of the reducing gas passing through the ion generator thereby forming a negatively charged reducing gas at the gas outlet;
    supplying energy to the magnetic coil to provide a magnetic field proximal to the negatively charged reducing gas; and
    contacting the target assembly with the negatively charged reducing gas to reduce the metal oxides on the at least one surface of the at least one component,
    wherein the pressure within the remote ion generator is from 1 to 20 atmospheres.

2. The method of claim 1 wherein the anode comprises an insulating material disposed upon at least a portion of its surface.

3. The method of claim 1 wherein the temperature of the gas mixture within the ion generator ranges from 25° C. to 3,500° C.

4. The method of claim 3 wherein the temperature of the gas mixture within the ion generator ranges from 150° C. to 1,500° C.

5. The method of claim 1 wherein the temperature of the cathode ranges from 25° C. to 3,500° C.

6. The method of claim 5 wherein the temperature of the cathode ranges from 150° C. to 1,500° C.

7. The method of claim 1 wherein the energy in the supplying step is at least one source selected from the group consisting of an electric energy source, an electromagnetic energy source, a thermal energy source, a photo energy source, and combinations thereof.

8. The method of claim 1 wherein the energy is applied to the cathode.

9. The method of claim 1 wherein the pressure within the ion generator ranges from 1 to 5 atmospheres.

10. The method of claim 1 wherein the cathode is composed of a material selected from the group consisting of brass, stainless steel, copper, nickel chromium, aluminum, tungsten, graphite, metal oxides deposited on a metal substrate, and mixtures thereof.

11. The method of claim 10 wherein the cathode is composed of nickel chromium.

12. The method of claim 1 wherein the cathode has a geometry selected from the group consisting of a wire, a coil, a screen, a rod, a rod with a sharp tip, an array of rods with sharp tips, a brush comprised of wires, a plate with protrusions emanating from at least one of its surfaces, a rod with protrusions emanating from its surface, and mixtures thereof.

13. The method of claim 1 wherein the distance between the component and the outlet of the ion generator ranges from 0.1 to 30 cm.

14. The method of claim 13 wherein the distance between the component and the outlet of the ion generator ranges from 0.5 to 5 cm.

15. The method of claim 1 wherein the remote ion generator is moved.

16. The method of claim 1 wherein the target assembly is moved.

17. The method of claim 16 wherein the remote ion generator is moved.

18. The method of claim 1 wherein the method is used in at least one process from the group consisting of reflow soldering, wave soldering, wafer bumping, metal plating, brazing, welding, surface cleaning, thin film de-oxidation, and mixtures thereof.

19. The method of claim 1 wherein the substrate has a positive electrical potential.

20. The method of claim 1 wherein the substrate is grounded.

21. The method of claim 1 wherein the reducing gas is selected from the group consisting of $H_2$, CO, $SiH_4$, $Si_2H_6$, $CF_4$, $SF_6$, $CF_2Cl_2$, HCl, $BF_3$, $WF_6$, $UF_6$, $SiF_3$, $NF_3$, $CClF_3$, HF, $NH_3$, $H_2S$, straight, branched or cyclic $C_1$ to $C_{10}$ hydrocarbons, formic acid, alcohols, acidic vapors having the following formula (III):

(III)

organic vapors having the following formula (IV),

(IV)

and mixtures thereof wherein substituent R in formula III and IV is an alkyl group, a substituted alkyl group, an aryl group, or a substituted aryl group.

22. The method of claim 21 wherein said gas mixture comprises from 0.1 to 100% by volume of hydrogen.

23. The method of claim 22 wherein said gas mixture comprises from 0.1 to 4% by volume of hydrogen.

* * * * *